(12) United States Patent
Heller

(10) Patent No.: US 8,115,399 B2
(45) Date of Patent: Feb. 14, 2012

(54) OLED LIGHT SOURCE

(75) Inventor: Christian Maria Anton Heller, Albany, NY (US)

(73) Assignee: General Electric Company, Niskayuna, NY (US)

(*) Notice: Subject to any disclaimer, the term of this patent is extended or adjusted under 35 U.S.C. 154(b) by 1031 days.

(21) Appl. No.: 12/033,189

(22) Filed: Feb. 19, 2008

(65) Prior Publication Data

US 2009/0206761 A1 Aug. 20, 2009

(51) Int. Cl.
*H05B 37/00* (2006.01)

(52) U.S. Cl. ............ 315/160; 257/79; 313/49; 313/504; 315/169.3; 315/172

(58) Field of Classification Search ............ 257/79; 313/49, 504; 315/169.3, 160, 172
See application file for complete search history.

(56) References Cited

U.S. PATENT DOCUMENTS

| | | | |
|---|---|---|---|
| 4,768,292 A | 9/1988 | Manzei | |
| 5,141,671 A | 8/1992 | Bryan et al. | |
| 5,150,006 A | 9/1992 | Van Slyke et al. | |
| 5,151,629 A | 9/1992 | VanSlyke | |
| 5,294,870 A | 3/1994 | Tang et al. | |
| 5,405,709 A | 4/1995 | Littman et al. | |
| 5,593,788 A | 1/1997 | Shi et al. | |
| 5,645,948 A | 7/1997 | Shi et al. | |
| 5,683,823 A | 11/1997 | Shi et al. | |
| 5,755,999 A | 5/1998 | Shi et al. | |
| 5,928,802 A | 7/1999 | Shi et al. | |
| 5,935,720 A | 8/1999 | Chen et al. | |
| 5,935,721 A | 8/1999 | Shi et al. | |
| 6,020,078 A | 2/2000 | Chen et al. | |
| 6,107,734 A | 8/2000 | Tanaka et al. | |
| 6,337,492 B1 * | 1/2002 | Jones et al. | 257/40 |
| 6,441,551 B1 * | 8/2002 | Abe et al. | 313/503 |
| 6,534,199 B1 | 3/2003 | Hosokawa et al. | |
| 6,717,358 B1 | 4/2004 | Liao et al. | |
| 6,771,021 B2 * | 8/2004 | Cok | 313/512 |
| 2003/0170491 A1 | 9/2003 | Liao et al. | |
| 2005/0280359 A1 * | 12/2005 | Liu et al. | 313/504 |
| 2006/0201181 A1 * | 9/2006 | Bauer et al. | 62/264 |

OTHER PUBLICATIONS

Patent Abstracts of Japan, Application No. 2003-045676; Publication No. 2004-257006; Applicant: Bunka Shutter Co., Ltd., dated Sep. 16, 2004, 1 page.

* cited by examiner

*Primary Examiner* — David Vu
*Assistant Examiner* — Brandon Fox
(74) *Attorney, Agent, or Firm* — Mary Louise Gioeni

(57) ABSTRACT

Organic light emitting diode (OLED) light source includes a plurality of stacked organic light emitting diode units comprised of a removable topmost organic light emitting diode unit and one or more removable underlying organic light emitting diode units. A power source is in electrical communication with the anode and the cathode of the topmost organic light emitting diode unit, wherein the underlying organic light emitting diode units are free from contact with the power source. As such, each OLED is sequentially operated upon removal of the topmost OLED unit, thereby providing redundancy as well as extending the operating lifetime of the OLED light source. Also disclosed are processes for operating the OLED light source.

6 Claims, 3 Drawing Sheets

OLED LIGHT SOURCE

BACKGROUND OF THE INVENTION

The present disclosure generally relates to an organic light emitting diode (OLED) light source, and more particularly, to an OLED light source having multiple stacked OLED devices wherein each OLED device is removable from an underlying non-active OLED device.

An organic light-emitting diode device, also called an OLED, commonly includes an anode, a cathode, and an organic electroluminescent unit sandwiched between the anode and the cathode. The organic electroluminescent unit generally includes a hole-transporting layer, a light-emitting layer, and an electron-transporting layer, among others. A power source is attached to the anode and cathode, OLEDs are attractive because of their low drive voltage, high efficiency, high luminance, wide viewing-angle, and capability for full color displays, general lighting, and for other applications.

When a proper voltage is applied, the anode injects holes and the cathode injects electrons into the organic electroluminescent unit. The injected holes and electrons each migrate toward the oppositely charged electrode. When an electron and hole localize on the same molecule, an "exciton" is produced, which is a localized electron-hole pair having an excited energy state. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

OLEDs can emit different colors, such as red, green, blue, or white, depending on the emitting property of its light emitting layer. Efficient white light producing OLED devices are considered a low cost alternative for several applications such as paper-thin light sources, backlights in LCD displays, automotive dome lights, office lighting, and the like. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

One of the problems with conventional OLED devices is with regard to luminance efficiency and operating lifetime. Over time, the device is subject to decay and as a result luminance drops as a function of time. By way of example, many conventional OLED devices have an operating lifetime of about 5 years or less before replacement is required due to a decrease in luminance, i.e., brightness, relative to an initial value. This operational lifetime further decreases when the OLED is driven at still higher brightness, where the higher brightness would allows making the device smaller and thus cheaper for some applications. Moreover, when OLEDs are built for flexibility and/or for speed of fabrication on thin barrier-coated plastic substrates or when they are encapsulated with thin-film barriers, small holes in the barriers can lead to the growth of dark spots overtime. Because of this, the use of conventional OLED devices as a light source has not been considered as a practical alternative to other types of lighting systems, e.g., LEDs, incandescent, fluorescent, and the like. To address the problem of luminance efficiency and operating lifetime, a tandem OLED structure (sometimes called a stacked OLED or cascaded OLED) has been disclosed by Jones et al, in U.S. Pat. No. 6,337,492, Tanaka et al in U.S. Pat. No. 6,107,734, Kido et al. in JP Patent Publication 2003/045676A and in U.S. Patent Publication 2003/0189401 A1, and Liao et al. in U.S. Pat. No. 6,717,358 and U.S. Patent Application Publication 2003/0170491 A1. This tandem OLED is fabricated by stacking several individual OLED units vertically and driving the stack using a single power source, wherein each of the individual OLED units are simultaneously powered by the single power source. The advantage is that luminance efficiency, lifetime, or both are reported to have been increased. However, as expected, the tandem structure increases the driving voltage approximately in proportion to the number of OLED units stacked together.

A need exists for OLED light sources that have increased operating lifetimes.

BRIEF SUMMARY OF THE INVENTION

Disclosed herein are organic light emitting diode sources and processes for operating the light source. In one embodiment, the organic light emitting diode light source comprises a plurality of stacked organic light emitting diode devices comprised of a removable topmost organic light emitting diode device and one or more removable underlying organic light emitting diode devices, each organic light emitting diode device comprising an anode, a cathode, at least one light emitting layer disposed between the anode and the cathode, and a substrate; and a power source in electrical communication with the anode and the cathode of the topmost organic light emitting diode device, wherein the underlying organic light emitting diode devices are free irons contact with the power source.

In one embodiment, the process operating an organic light emitting diode light source comprises stacking a plurality of organic light emitting diode devices, wherein the stacked organic light emitting diode devices comprise a topmost organic light emitting diode device and one or more underlying organic light emitting diode devices, each organic light emitting diode device comprising an anode, a cathode, and at least one light emitting layer disposed between the anode and the cathode; and selectively contacting a power source in electrical communication with the anode and the cathode of the topmost organic light emitting diode device, wherein the power source is configured to contact the underlying organic light emitting diode devices upon removal of the topmost organic light emitting diode device.

These and other features and advantages of the embodiments of the invention will be more fully understood from the following detailed description of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the invention can be best understood when read in conjunction with the following figures, which are exemplary embodiments, in which.

Skilled artisans will appreciate that elements in the figures are illustrated for simplicity and clarity and have not necessarily been drawn to scale.

DETAILED DESCRIPTION OF THE INVENTION

Disclosed herein is an OLED light source that includes multiply stacked OLED devices, wherein the topmost OLED device is in independent electrical communication with a single power source and is releasably attached to, i.e., frangibly fused to or weakly adhered to, an underlying OLED device that is not in electrical communication with the single power source. The single power source is configured to provide sequential electrical communication to the immediate underlying OLED device upon removal of the topmost OLED device. In this manner, the immediate underlying OLED device is activated upon removal of the topmost OLED device. Advantageously, the topmost OLED may be removed from the stack and deactivated when the decay of the light emitting layer is of a magnitude insufficient for the intended light application; when there is a failure of the topmost OLED device; when there is a undesired defect in the OLED device, when a different emitted light spectrum is desired; and the like. As such, the operating lifetime of the OLED light source can advantageously be extended as a function of the number of OLED devices in the stack.

Figure 1:
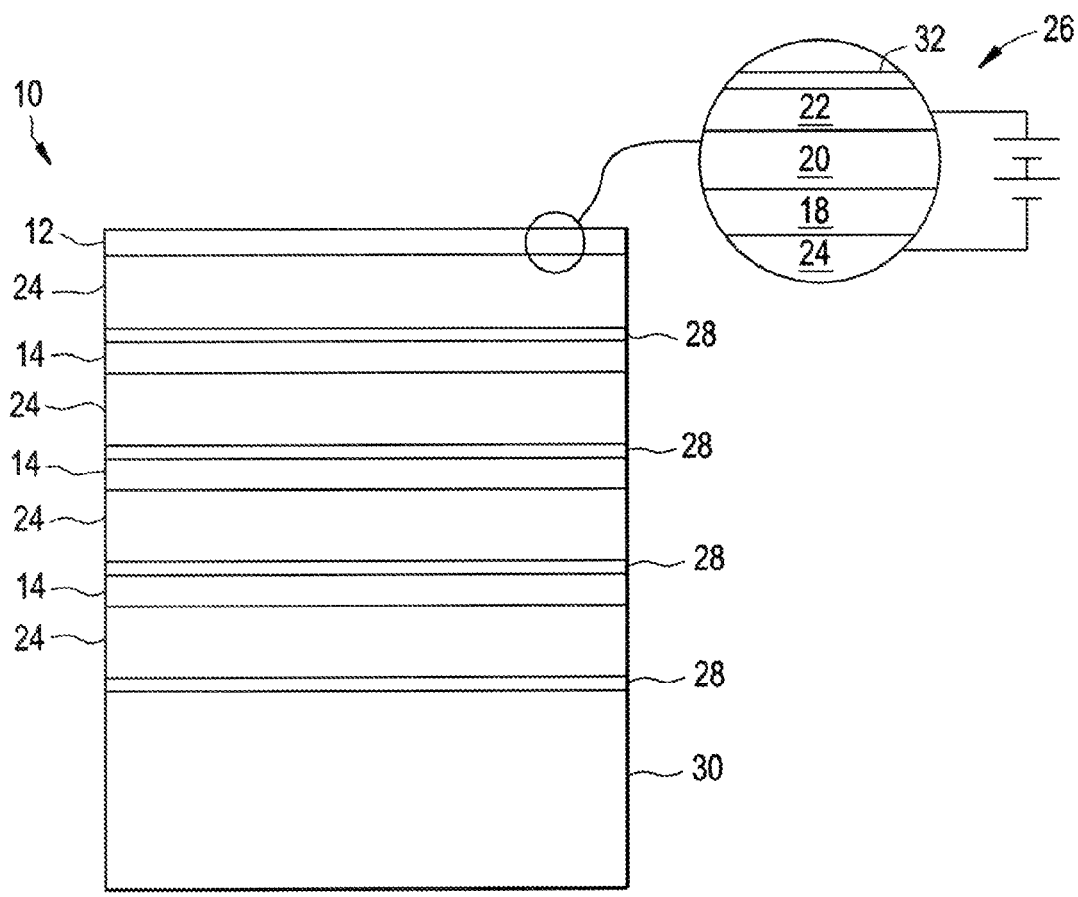
FIG. 1 schematically illustrates an exemplary OLED light source in accordance with an embodiment.

Turning now to FIG. 1, there is shown a cross-sectional view of an exemplary stacked OLED light source, generally designated by reference numeral 10. The OLED light source includes a topmost "up-emitting" OLED device 12 stacked onto one or more OLED devices 14 as shown. For exemplary purposes, three underlying OLED devices 14 are shown. However, the number of stacked OLED devices is not intended to be limited and will generally depend on the intended application. Each OLED device 12, 14 is frangibly fused and/or weakly adhered to an adjacent OLED device.

As shown in the enlarged portion of FIG. 1, each OLED device 12, 14 generally includes an anode 18, a cathode 22 spaced from anode 18, and at least one light emitting layer 20 disposed between the anode and the cathode, all of which are disposed on a substrate 24. A thin film barrier 32 may also be disposed between each OLED device and may be integrated into the fabrication process of the OLED by depositing the thin film barrier film on the upper layer, e.g., the anode or cathode depending on the particular configuration. A single power source 26 is disposed in electrical communication with the topmost OLED device and more particularly, in electrical communication with the anode 18 and the cathode 22. The power source 26 is configured to power the immediate underlying OLED device 14 upon removal of the topmost OLED device 12. Upon application of power, current passes through the electrodes so as to generate light in the topmost OLED light emitting structure 12 only. The various OLED devices 12, 14 can be disposed on a relatively rigid base substrate 30 to facilitate ease in removal of the topmost OLED device 12. It will be understood that the relative locations of the anode 18 and cathode 20 may be reversed with respect to the substrate 30 if the structure of the multiple layers that define the organic light emitting layer 20 is likewise reversed, and the top-most electrode is sufficiently transparent. The base substrate 30 may further include electrical connections, power conditioning components, mounting components for attachment to a surface, or the like.

Figure 2:
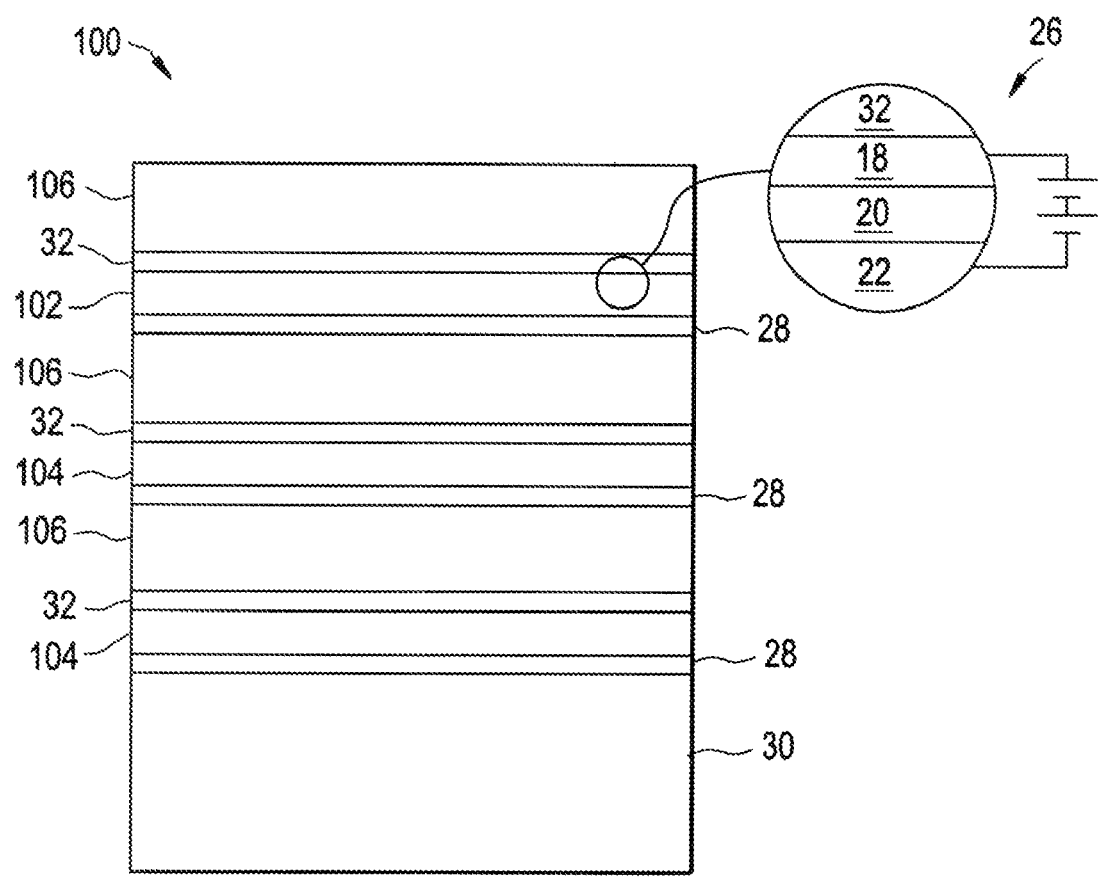
FIG. 2 schematically illustrates an exemplary OLED light source in accordance with another embodiment.

FIG. 2 illustrates an exemplary embodiment of an OLED light source 100 wherein the substrate is transparent and serves as the upper most layer of the "down-emitting" OLED device. The OLED light source includes a topmost OLED device 102 stocked onto one or more OLED devices 104, three of which are shown. As shown in the enlarged portion of FIG. 3, each OLED device 102, 104 generally includes an anode 18, a cathode 22 spaced from anode 18, and at least one light emitting layer 20 disposed between the anode and the cathode, all of which are disposed on a transparent substrate 106. A thin film barrier 32 may also be disposed between each OLED device and the transparent substrate 106. A single power source 26 is disposed in electrical communication with the topmost OLED device and more particularly, in electrical communication with the anode 18 and the cathode 20. As discussed in the previous embodiments, the power source 26 is configured to power the immediate underlying OLED device 104 upon removal of the topmost OLED device 102. The various OLED devices 102, 104 can be disposed on a relatively rigid base substrate 30 to facilitate ease in removal of the topmost OLED device 106. The base substrate 30 may further include electrical connections, power conditioning components, mounting components for attachment to a surface, or the like.

In either embodiment, an adhesive 28 may be disposed between each OLED device. Any adhesive can be used so long as when the topmost OLED device is removed relative to an underlying OLED device, the topmost OLED device readily detaches from the surface of the underlying OLED device without leaving any visible residue or discoloration on the surface, i.e., the shear strength provided by the adhesive is relatively low such that the topmost OLED device 12 can be readily removed as desired from the underlying OLED device 14. In the optimal case, the customer could just pull on a (e.g., numbered) tab placed on an edge of the product to pull off the top-most OLED film that has expended its useful life or is otherwise damaged or contaminated. In the event adhesive remains on the surface, the adhesive should be selected to be substantially transparent at the emitted wavelengths of the underlying OLED device. In one embodiment, the adhesive layer is less than 0.001 millimeter and each OLED device 12 or 14 including the substrate is less than 0.1 millimeters.

Selection of a suitable pressure sensitive adhesive is well within the skill of those in the art. For example, suitable pressure sensitive adhesives include rubber pressure-sensitive adhesives, acrylic pressure-sensitive adhesives, polyester pressure-sensitive adhesives, urethane pressure-sensitive adhesives, polyamide pressure-sensitive adhesives, epoxy pressure-sensitive adhesives, vinyl alkyl ether pressure-sensitive adhesives, silicone pressure-sensitive adhesives, fluorine-containing pressure-sensitive adhesives. One or more such pressure-sensitive adhesives may be used herein either singly or as combined. The pressure-sensitive adhesives may be in any form of emulsion pressure-sensitive adhesives, solution pressure-sensitive adhesives, oligomer pressure-sensitive adhesives or solid pressure-sensitive adhesives.

The pressure-sensitive adhesives may contain, in addition to the polymer component that serves as the pressure-sensitive adhesive component (base polymer) thereof, any additives such as tackifiers (e.g., rosin derivative resin, polyterpene resin, petroleum resin, phenolic resin), plasticizers, tillers, anti-aging agents, flame retardants, and the like.

In other embodiments, magnetic or electrostatic attraction is utilized. For example, the magnets can be disposed at the periphery of each OLED device unit or electrostatic attraction between the units can be employed.

The emitting layer 20 of the OLED devices generally includes a luminescent or fluorescent material where electroluminescence is produced as a result of electron-hole pair recombination in this region and is configured to emit light within the visible spectrum, wherein the particular spectrum is not intended to be limited and will generally depend on the intended application. The light-emitting layer can be comprised of a single material or multiple materials. For example, the light emitting layer may include a host material doped with a guest compound or compounds where light emission comes primarily from the dopant and can be of any color. The host materials in the light-emitting layer can be an electron-transporting material, a hole-transporting material, or another material or combination of materials that support hole-electron recombination. Likewise, to generate the desired spectrum, the light emitting layer may include one or more emitters. For example, if white light emission is desired, the light emitting layer 20 may include first and second emitters that emit complementary, or nearly complementary colors. The combination of light emission between the two complementary colors can be selected to cover most of the visible spectrum in order to produce useful white light. For example, the first light emitter can emit yellow and the second light emitter can emit blue. Other combinations such as red and cyan are possible. It should be noted that each OLED device 12, 14 can have the same or different emitted light spectrums as may be desired for different applications. Likewise, the OLED light source 10 can be configured to emit light within the visible spectrum to produce a variety of colors.

Emitting molecules known to be of use include, but are not limited to, those disclosed in U.S. Pat. Nos. 4,768,292; 5,141,671; 5,150,006; 5,151,629; 5,294,870; 5,405.709; 5,484,922; 5,593,788; 5,645,948; 5,683,823; 5,755,999; 5,928,802; 5,935,720; 5,935,721; 6,020,078; and 6,534,199.

Common materials useful in this disclosure for the anode 18 are indium-tin oxide and tin oxide, but other suitable metal oxides include, but are not limited to, aluminum- or indium-doped zinc oxide, magnesium-indium oxide, and nickel-tungsten oxide. In addition to these oxides, metal nitrides such as gallium nitride, metal selenides such as zinc selenitic, and metal sulfides such as zinc sulfide, can be used as an anode material. Desired anode materials can be deposited by any suitable way such as evaporation, sputtering, chemical vapor deposition, or electrochemical means. In addition, ultra-thin metal films can be used by themselves or in combination of one of the previous layers to decrease the sheet resistance. Anode materials can be patterned using well known photolithographic processes.

Cathode 22 is spaced, meaning it is vertically spaced apart from anode 18. In the embodiment of FIG. 1, the cathode materials should be transparent or substantially transparent to the emission of interest. For such applications, metals, if used, should be thin or one should use transparent conductive oxides, or include these materials. When light emission is through the anode 30, the cathode 22 material can be comprised of nearly any conductive material. When needed, patterning can be achieved through many well known methods including, but not limited to, through-mask deposition, integral shadow masking, laser ablation, and selective chemical vapor deposition. The cathode can be deposited by evaporation, sputtering, or chemical vapor deposition. Desirable materials have effective film-forming properties to ensure effective contact with the underlying organic layer, promote electron injection at low voltage, and have effective stability. Useful cathode materials often contain a low work function metal (<3.0 eV) or metal alloy. Another suitable class of cathode materials includes bilayers comprised of a thin layer of a low work function metal or metal salt capped with a thicker layer of conductive metal.

The substrate 24 can be an organic solid, an inorganic solid, or include organic and inorganic solids. Likewise, the substrate can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate can be a homogeneous mixture of materials, a composite of materials, or multiple layers of materials. The substrate can either be light transmisslve or opaque, depending on the intended direction of light emission. The light transmissive property is desirable for viewing the electroluminescent emission through the substrate. Transparent glass or plastic is commonly employed in such cases. For applications where the emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit, board materials, or any others commonly used in the formation of OLED devices.

The simple layered structures illustrated in FIGS. 1 and 2 is provided by way of non-limiting examples, and it is understood that embodiments of the disclosure may be used in connection with a wide variety of other structures.

Depending on the application, the power source 26 can be manually connected to each sequential OLED device in any of the embodiments discussed above that is activated or may be configured such that upon removal of the topmost OLED device, the power source automatically connects to the immediately underlying OLED device.

Figure 3:
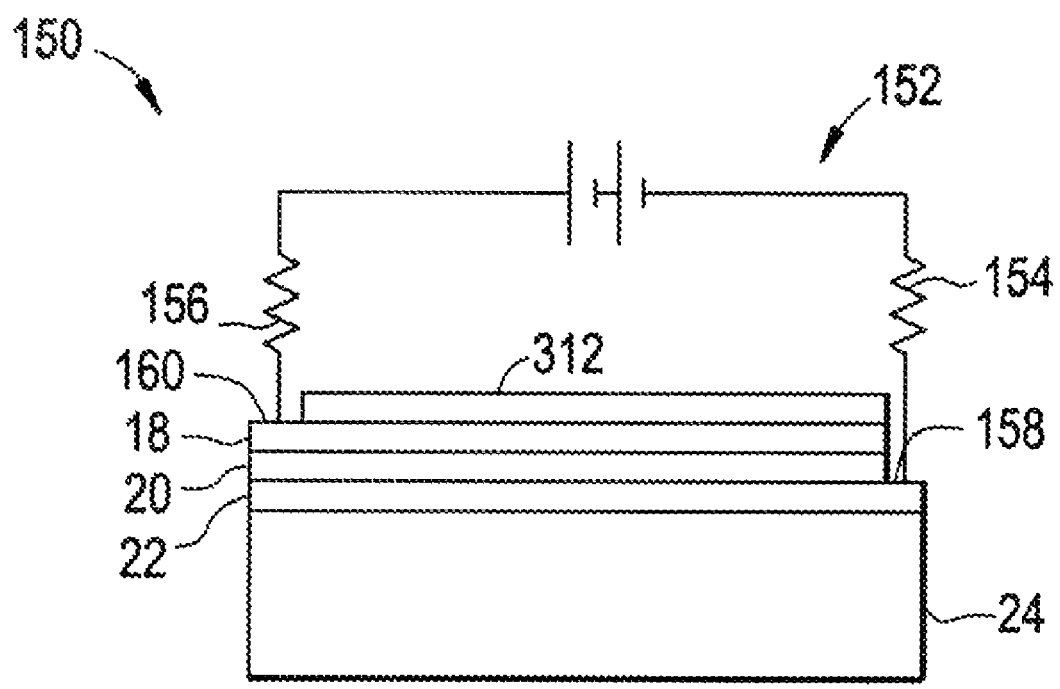
FIG. 3 schematically illustrates an exemplary power source for use with the OLED light source in accordance with one embodiment.

By way of example, FIG. 3 shows a power supply 152 suitable for use with any of the OLED light sources described above. The illustrated schematic provides simplified illustration of electrical communication of the power source with the OLED device that includes spring loaded contacts 154, 156 in electrical communication with the anode 18 and cathode 22, respectively, of the topmost OLED device e.g., device 12 as shown in FIG. 1. The anode and the cathode include portions 158, 160 that extend outside the barrier layer 32 to permit loading of spring contacts 154, 156. The spring-loaded contacts 154, 156 are configured to permit the topmost OLED device to be removed from the underlying OLED device and provide subsequent loading on the anode and cathode of the underpaying OLED device. For the up-emitting 'metal-foil' configuration (FIG. 1) this is relatively simple. For the down-emitting 'substrate-on-the-outside' configuration (FIG. 3), electrical communication can be provided by punching holes into the substrate to connect to a thin metal foil on the other side, or by having thin metal leads coming out the side. Upon removal, the spring contacts are configured to contact the extended portions of the immediate underlying OLED device 14 upon removal of the topmost OLED device 12.

Alternatively, clips can be used to attach the power source to the respective anode and cathodes.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. In addition, barrier layers are supplied on both sides. As the substrate, glass or metal foils can be used, both of which are impermeable to moisture and oxygen. Plastic films are appealing because they are very flexible and transparent to light, but are generally insufficient as barriers and thus have to be coated with a thin-film barrier. Examples of thin-film barriers include, but are not limited to $SiO_x$, $Si_xN_y$, $Al_xO_y$, and alternating inorganic/polymeric layers are often used to encapsulate the OLED device. By providing redundancy in the form of multiply stacked and removable OLEDs, moisture and oxygen resistances are inherently provided and the operating lifetime is significantly extended and limited only by the number of OLED layers present. Dedicated desiccant layers can be easily added to further increase the shelf life. To decrease moisture and oxygen permeation coming from the side of the stack, the adhesive and any permeable substrates can be made as thin as possible and selected to provide minimal moisture and oxygen permeability. Still further, the use of redundant OLED units as described herein provides an alternative to cleaning (the build-up of dust can absorb light and thus reduce the brightness/efficiency), which can damage the OLED as well as affect light transmittance.

It will be understood that when an element is referred to as being "on" another element, it can be directly on the other element or intervening elements can be present there between. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments of the invention belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While embodiments of the invention have been described with reference to exemplary embodiments, it will be understood by those skilled in the art that various changes can be made and equivalents can be substituted for elements thereof without departing from the scope of the embodiments of the invention, in addition, many modifications can be made to adapt a particular situation or material to the teachings of embodiments of the invention without departing from the essential scope thereof. Therefore, it is intended that the embodiments of the invention not be limited to the particular embodiment disclosed as the best mode contemplated for carrying out this invention, but that the embodiments of the invention will include ail embodiments felling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A process operating an organic light emitting diode light source, the process comprising:

stacking a plurality of organic light emitting diode devices, wherein the stacked organic light emitting diode devices comprise a topmost organic light emitting diode device and one or more underlying organic light emitting diode devices, each organic light emitting diode device comprising an anode, a cathode, and at least one light emitting layer disposed between the anode and the cathode; and selectively contacting a power source in electrical communication with the anode and the cathode of the topmost organic light emitting diode device, wherein the power source is configured to contact the underlying organic light emitting diode devices upon removal of the topmost organic light emitting diode device.

2. The process of claim 1, wherein stacking the plurality of organic light emitting diode devices comprises disposing an adhesive between each one of the organic light emitting diode devices, wherein the adhesive is selected to permit release of the topmost organic light emitting diode device relative to the underlying organic light emitting diode device.

3. The process of claim 1, wherein stacking the plurality of organic light emitting diode devices comprises magnetically attracting the organic light emitting diode devices to form the stack.

4. The process of claim 1, wherein stacking the plurality of organic light emitting diode devices comprises electrostatically attracting the organic light emitting diode devices to form the stack.

5. The process of claim 1, wherein the power source sequentially contacts the underlying organic light emitting diode devices upon removal thereof.

6. The process of claim 1, wherein the power source comprises spring loaded contacts in electrical communication with the anode and the cathode of the topmost organic light emitting diode device.

* * * * *